United States Patent [19]

Kadono et al.

[11] 4,158,883

[45] Jun. 19, 1979

[54] REFRESH CONTROL SYSTEM

[75] Inventors: Shinji Kadono, Kodaira; Tsuneyo Chiba, Tsukui; Kiyoshi Umezawa, Owara-asahi, all of Japan

[73] Assignee: Hitachi, Ltd., Japan

[21] Appl. No.: 737,350

[22] Filed: Nov. 1, 1976

[30] Foreign Application Priority Data

Oct. 31, 1975 [JP] Japan .................. 50-130462

[51] Int. Cl.$^2$ .................. G06F 13/00; G11C 7/00
[52] U.S. Cl. .................. 364/200; 365/222
[58] Field of Search .................. 365/222; 364/200

[56] References Cited

U.S. PATENT DOCUMENTS

| | | | |
|---|---|---|---|
| 3,760,379 | 9/1973 | Nibby, Jr. et al. | 340/173 DR X |
| 3,800,295 | 3/1974 | Anderson, Jr. et al. | 340/173 DR |
| 3,810,129 | 5/1974 | Behman et al. | 340/173 DR |

Primary Examiner—Raulfe B. Zache
Attorney, Agent, or Firm—Craig and Antonelli

[57] ABSTRACT

In a refresh control system including a main memory having a volatile memory, at least one processing unit for accessing the main memory, a memory bus for effecting signal transfer between the main memory and the processing unit and a supervision circuit for allotting use of the memory bus in response to a request signal, the refresh control system is characterized by a refresh control circuit for transferring the request signal to the supervision circuit at the time the refresh signal is required and for commanding the initiation of the refresh operation to the main memory in response to a grant signal from the supervision circuit.

15 Claims, 9 Drawing Figures

REFRESH CONTROL SYSTEM

BACKGROUND OF THE INVENTION

The present invention relates to a refresh control system for a memory of the volatile type in a data processing system.

In a data processing system, a main memory is generally accessed by plural processing units through a memory bus. A volatile memory, such as a memory of MOS type, can be used as the main memory in the data processing system. In a MOS type memory element, the memory operation is performed by regarding the stored information as a logical value "1" or "0" in response to whether or not the stray capacitor between the gate and the substrate thereof is charged. However, in such a memory element, the charge of the stray capacitor tends to leak away and the information stored is lost with the lapse of time. Therefore, in order to maintain the stored information, it is required to periodically refresh the stored information in accordance with a predetermined cycle.

In a prior art refresh control system for accomplishing such a refresh operation, the refresh operation and accessing operation are selectively initiated in response to initiation signals for refresh and access. In such a system, since the initiation signal for refresh is asynchronous with the initiation signal for access, there is provided a flip-flop for synchronizing these signals. Since the output of the flip-flop is unstable during a period when the rising time of the refresh initiation signal is near to the rising time of the accessing initiation signal, the initiation of the operations must be delayed until the time when the output of the flip-flop becomes stable. Therefore, a long time is necessary for accessing of the main memory.

In order to avoid such a disadvantage, it is possible to synchronize the accessing initiation signal with the refresh initiation signal by transferring clock signals from the processing unit to the main memory. However, such a system has disadvantages in that the number of interface signal lines between the processing unit and the main memory are increased and the signals of the plural processing units must be synchronized with the signals of the main memory in a system in which the main memory is accessed by plural processing units.

On the other hand, a system can be realized in which the processing unit is interrupted by the refresh request and the refresh operation is executed after getting clearance for the interruption. However, such a system has disadvantages in that the number of interface signal lines is increased for interruption between the processing unit and the main memory unit and it is required to provide a control circuit for the interruption in the processing unit.

SUMMARY OF THE INVENTION

An object of the present invention is to provide a refresh control system which makes it possible to accomplish the memory accessing operation at high speed.

Another object of the present invention is to provide a refresh control system which is not required to provide extra interface signal lines or an additional control circuit.

In order to achieve such objects, the present invention is characterized by provision of means for transferring the request for the use of the memory bus to a memory bus supervision circuit when the request for the refresh operation occurs and for initiating the refresh operation after obtaining the permission for use of the memory bus from the memory bus supervision circuit.

BRIEF DESCRIPTION OF THE DRAWINGS

FIGS. 3b and 3c are diagrams showing signal waves for explaining the operation of the flip-flop shown in FIG. 3a;

DETAILED DESCRIPTION OF THE PRIOR ART

Figure 1:
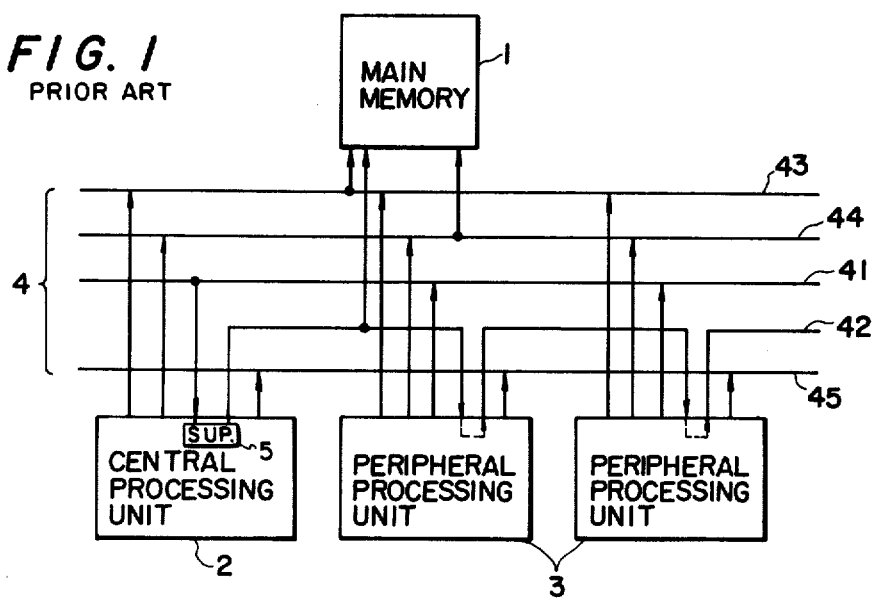
FIG. 1 is a schematic block diagram showing the fundamental construction of a prior art data processing system.

FIG. 1 shows the construction of a prior art data processing system. In FIG. 1 numeral 1 indicates a main memory, numeral 2 indicates a central processing unit, numeral 3 designates one or more peripheral processing units, such as input/output control devices, and numerals 41 to 45 designate interface signal lines constituting a memory bus 4. In the memory bus 4, the signal line 41 is provided for transferring a memory request signal from the processing units 3 to the processing unit 2. To get permission for use of the memory bus, the signal line 42 is provided for transferring a grant signal responsive to the memory request signal from the processing unit 2 to the processing unit 3. The signal lines 43, 44, and 45 are provided for transferring a memory address signal, a memory initiation signal, and an order signal showing the operation mode, respectively, from the processing unit 2 or 3 to the main memory 1.

A supervision circuit 5 for supervising the memory bus is provided in the processing unit 2. This memory bus supervision circuit transfers the grant signal responsive to the memory request signal to the signal line 42 when the memory bus is not being used, and therefore, is available. That is, the bus 4 is considered available when no memory initiation signal is present on the signal line 44. The grant signal on the signal line 42 is transferred from the processing unit 3 having a higher priority to the processing unit 3 having a lower priority in a sequential manner. When the grant signal reaches the processing unit 3 having the highest priority, which has transferred the memory request signal to the signal line 41, it is prevented from transferring the grant signal to the subsequent processing unit 3.

When it is required to refer to the main memory 1 from a processing unit 3, the memory request signal is transferred from this processing unit 3 to the supervision circuit 5 of the processing unit 2 through the signal line 41. When the memory bus 4 is not being used, the grant signal is transferred from the supervision circuit 5 of the processing unit 2 to the processing unit 3 through the signal line 42 in response to the memory request signal. When the grant signal is received in the processing unit 3, the memory initiation signal is transferred from this processing unit 3 to the main memory 1 through the signal line 44 to initiate the accessing operation to the main memory 1. At the same time, the memory address signal and the mode order signal are transferred through the signal lines 43 and 45, respectively, from the processing unit 3 to the main memory 1.

Figure 2:
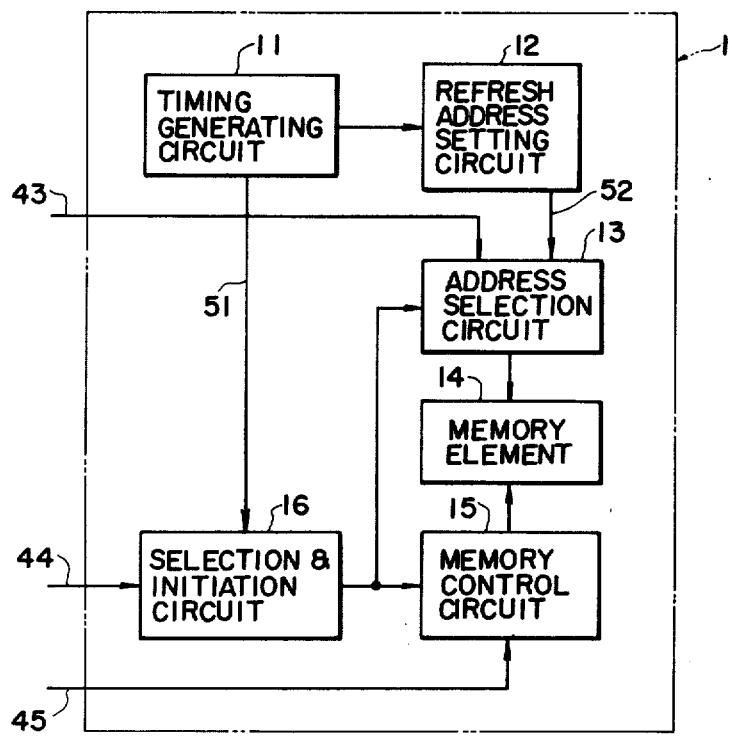
FIG. 2 is a schematic block diagram showing the specific construction of a prior art main memory including a refresh control circuit.

FIG. 2 shows the construction of a prior art main memory including a refresh control circuit. In FIG. 2 numeral 11 denotes a timing generating circuit for establishing the time interval of the refresh operation, numeral 12 designates a refresh address setting circuit for setting a refresh address, numeral 13 designates an address selection circuit, numeral 14 designates a memory element, numeral 15 designates a memory control circuit, numeral 16 designates a circuit for the selection and initiation, numeral 51 designates a signal line for a refresh initiation signal and numeral 52 designates a signal line for a refresh address signal.

With such a construction, when the memory initiation signal is transferred from the processing unit to the signal line 44 for accessing of the main memory 1, this signal is applied to the selection and initiation circuit 16 of the main memory 1. When the memory element 14 is not being operated at present, the circuit 16 is operated so as to initiate the accessing operation. By means of signals from the circuit 16, the memory address signal on the signal line 43 is transferred through the address selection circuit 13 to the memory element 14 and the operation mode responsive to the order signal on the signal line 45, that is, the reading or writing operation of the memory element 14, is performed by the control circuit 15.

On the other hand, at the time for the refresh operation, the refresh address is set into the setting circuit 12 by a signal from the timing generating circuit 11, and the refresh initiation signal is transferred through the signal line 51 from the timing generating circuit 11 to the selection and initiation circuit 16. When the memory element 14 is then not being operated, the refresh initiation signal is accepted by the circuit 16. This circuit 16 is operated so as to transfer the refresh address signal on the signal line 52 through the address selection circuit 13 to the memory element 14 and to execute the refresh operation of the memory circuit 14 under control of the control circuit 15.

Since the memory initiation signal is asynchronous with the refresh initiation signal, it is possible that the memory and refresh initiation signals may be simultaneously applied to the circuit 16. In such a case, synchronization between these signals is required in the circuit 16 so as to select either the refresh operation or the accessing operation, thereby limiting selection to only one operation.

Figure 3A:
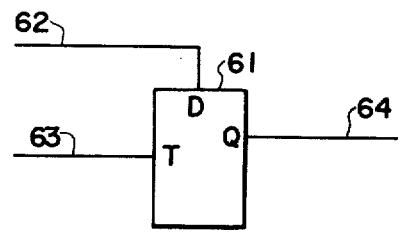
FIG. 3a is a diagram showing the construction of a flip-flop included in a prior art refresh control circuit.

A flip-flop 61, such as shown in FIG. 3a, is provided in the circuit 16 for effecting such synchronization. In FIG. 3a numeral 62 indicates a data signal lead, numeral 63 a trigger signal lead, and numeral 64 an output signal lead.

Figure 3B:
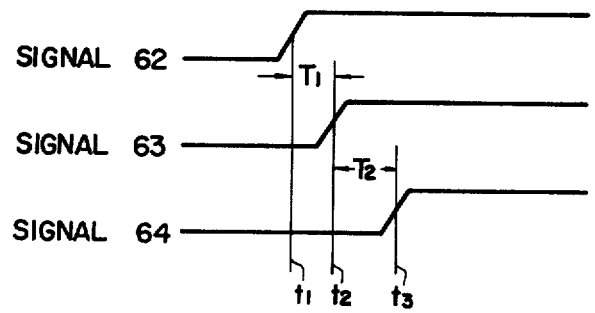
Figure 3C:
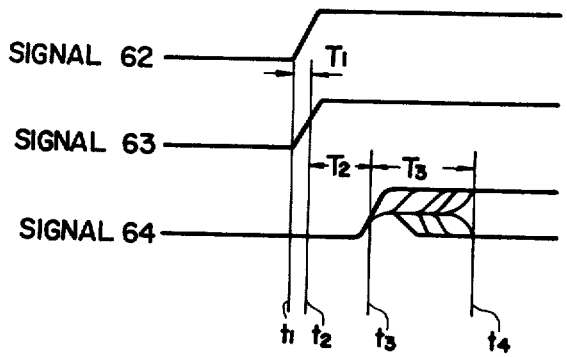

FIGS. 3b and 3c show signal waveforms for various conditions of operation of the circuit of FIG. 3a, respectively. In the case where the trigger signal 63, for example, the refresh initiation signal, is rising at time $t_2$, when a long period $T_1$ elapses after receipt of the data signal 62, for example, the memory initiation signal, is rising at time $t_1$ as shown in FIG. 3b, the output signal 64 is available. In other words, in a case where the period $T_1$ is longer than the set-up period of the flip-flop 61, the output signal 64 can be determined at time $t_3$ when the delay period $T_2$ elapses.

However, in the case where the trigger signal 63 is asynchronous with the data signal 62, there is the possibility that the period $T_1$ will be shorter than the set-up period of the flip-flop 61. In such a case, the output signal becomes unstable during a period $T_3$ after time $t_3$, as shown in FIG. 3c. Therefore, the output signal 64 is determined at time $t_4$ after the period $T_2+T_3$ elapses from the time the trigger signal 63 is rising at time $t_2$. The output signal 64 can be used for the first time only after the period $T_3$ when the output signal 64 again becomes stable. Thus, in the case where the memory initiation signal is asynchronous with the refresh initiation signal, the access time of the main memory is delayed by the period $T_3$.

DETAILED DESCRIPTION OF THE PREFERRED EMBODIMENTS

Figure 4:
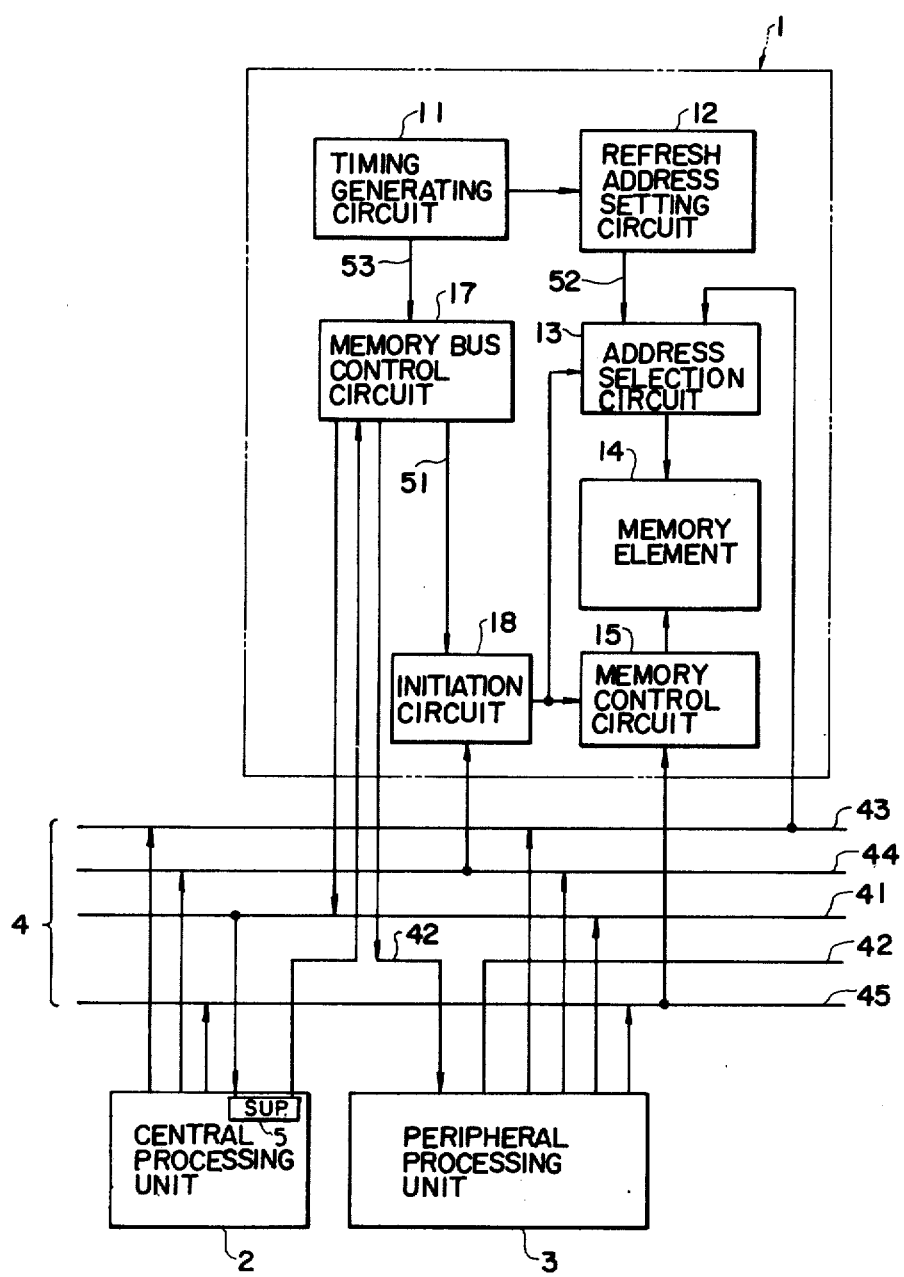
FIG. 4 is a schematic block diagram showing an embodiment of a memory control system according to the present invention.

FIG. 4 shows an embodiment of a refresh control system according to the present invention. In FIG. 4 numeral 17 denotes a memory bus control circuit for obtaining permission for use of the memory bus 4, numeral 18 designates an initiation circuit for commanding the initiation of the refresh operation or the accessing operation, and numeral 53 designates a signal line for a refresh memory request. The other elements are the same as those having corresponding reference numerals in FIGS. 1 and 2.

With such a circuit construction, when the memory initiation signal is transferred from the processing unit 2 or 3 to the initiation circuit 18 through the signal line 44, the initiation circuit 18 supplies signals to the control circuit 15 and the address selection circuit 13. The memory address signal on the signal line 43 is transferred through the address selection circuit 13 to the memory element 14 and the operation mode responsive to the order signal on the signal line 45 is performed by the control circuit 15. At the time for the refresh operation, the timing generating circuit 11 generates a refresh memory request signal. This request signal is transferred through the signal line 53 to the memory bus control circuit 17 and is, at the same time, transferred to the setting circuit 12. The memory request signal is then transferred from the control circuit 17 to a memory bus supervision circuit 5 of the central processing unit 2 through the signal line 41 to obtain permission for use of the memory bus 4. If the memory bus is then not being used, the grant signal is transferred from the memory bus supervision circuit 5 to the memory bus control circuit 17 through the signal line 42.

When the memory bus control circuit 17 accepts the grant signal and becomes a memory bus master, the initiation signal is transferred from the control circuit 17 to the initiation circuit 18. Signals are thereby transferred from the initiation circuit 18 to the address selection circuit 13 and the control circuit 15. The refresh address signal from the refresh address setting circuit 12 is transferred through the signal line 52 and the address selection circuit 13 to the memory element 14 and the refresh operation is executed under the control of the control circuit 15.

When the memory bus control circuit 17 is the memory bus master, the refresh initiation signal is transferred from the memory bus circuit 17. During the transfer of the refresh initiation signal, the memory initiation signal is not transferred from the processing unit. Therefore, the refresh initiation signal and the memory initiation signal are never inputted at the same time. Thus, synchronization of the asynchronous signals is unnecessary and the delay time previously necessary to the synchronization is not required.

As seen from the above-described embodiment, according to the present invention, it is possible to accomplish the accessing operation without the previously required delay time for synchronization. Furthermore, it is unnecessary to provide extra interface signal lines or an additional control circuit.

Figure 5:
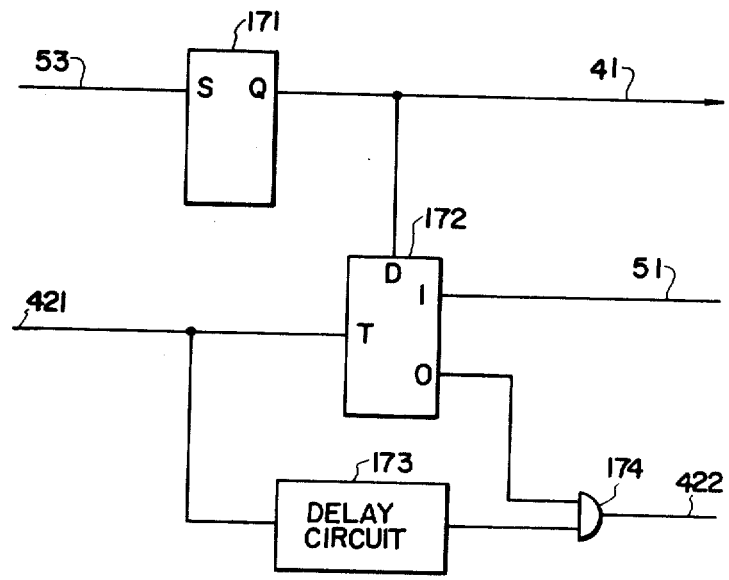
FIG. 5 is a diagram showing an example of a memory bus control circuit such as shown in FIG. 4.

FIG. 5 shows an example of a specific construction of the memory bus control circuit 17 as shown in FIG. 4. In FIG. 5, numerals 171 and 172 denote flip-flop circuits, numeral 173 designates a delay circuit, and numeral 174 identifies an AND gate. With such a construction, after the refresh memory request signal is transferred from the timing generating circuit 11 to the flip-flop 171 through the signal line 53, the memory request signal is transferred from the flip-flop 171 to the processing unit 2 through the signal line 41. At the same time, a signal from the flip-flop 171 is applied to the data terminal D of the flip-flop 172. The grant signal is transferred from the processing unit 2 to the trigger terminal T of the flip-flop 172 through the signal line 421. The refresh initiation signal is transferred to the signal line 51 in response to the grant signal and, at the same time, the grant signal is prevented from passing through the gate 174. When no memory request signal is transferred from the flip-flop 171, a signal from the flip-flop 172 is applied to the AND gate 174. Therefore, the grant signal delayed by the delay circuit 173 is transferred through the AND gate 174 and the signal line 422 to the processing unit 3.

Figure 6:
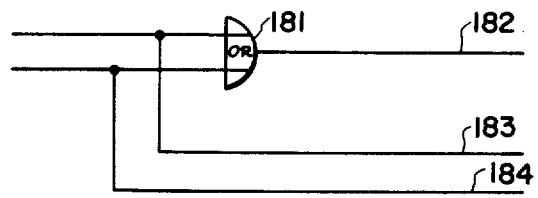
FIG. 6 is a diagram showing an example of a circuit for selection and initiation as shown in FIG. 4.

FIG. 6 shows an example of a specific construction of the initiation circuit 18 shown in FIG. 4. In FIG. 6 numeral 181 denotes an OR gate, numeral 182 designates a signal line for an initiation signal transferred to the memory control circuit 15, numerals 183 and 184 signal lines for mode signal to the address selection circuit 13 and the memory control circuit 15. When either one of the refresh initiation signal and the accessing initiation signal is applied to the OR gate 181, the initiation signal is transferred from the OR gate 181 to the memory control circuit 15 through the signal line 182, and, at the same time, the refresh or accessing initiation signal is transferred through the signal line 183 or 184 to the address selection circuit 13 and the control circuit 15 to determine the operation mode.

The number of the processing unit 2 or 3 is not restricted to the number shown in FIG. 4. Furthermore, the memory bus supervision circuit 5 may be provided in the main memory 1 or the processing unit 3.

Figure 7:
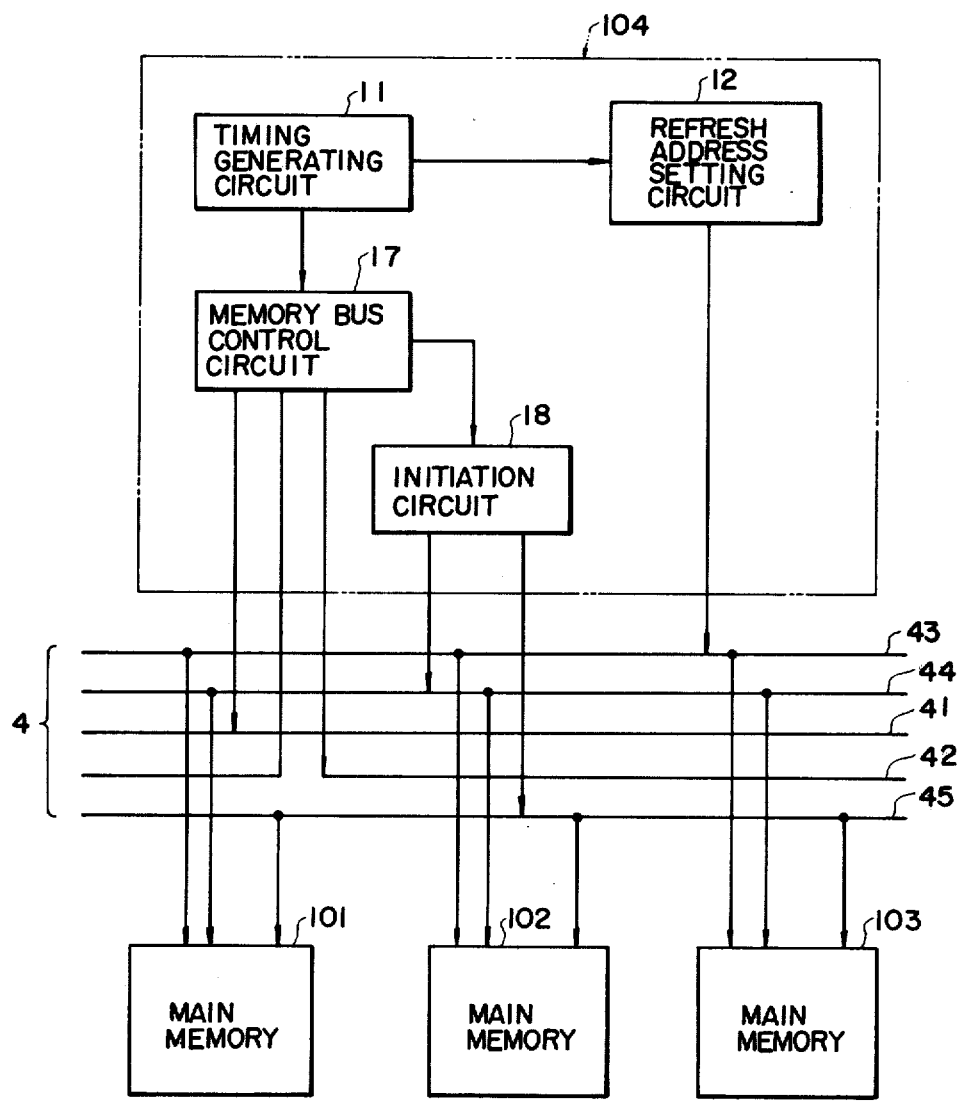
FIG. 7 is a schematic block diagram showing another embodiment of a refresh control system according to the present invention.

FIG. 7 shows another embodiment of a refresh control system according to the present invention, which has plural memory units 101 to 103 and a common refresh control circuit 104 for controlling the refresh operation of the memory units 101 to 103. The refresh control circuit 104 includes a timing generating circuit 11, a refresh address setting circuit 12, a memory bus control circuit 17 and an initiation circuit 18. Each of the memory units 101 to 103 includes a memory element, a memory control circuit and the like. The memory bus 4 is also connected to the processing units (not shown in the drawing).

With such a construction, when the memory bus control circuit 17 is the memory bus master, the refresh initiation signal from the initiation circuit 18 is transferred through the signal line 44 to the memory units 101 to 103 and the refresh address signal from the refresh address setting circuit 12 is transferred through the signal line 43 to the memory units 101 to 103. Furthermore, a signal representing the refresh operation from the initiation circuit 18 is transferred through the signal line 45 to the memory units 101 to 103.

The number of memory units is not restricted to the number thereof shown in FIG. 7. The refresh control circuits may be provided corresponding to the main memories. Furthermore, a unibus system may be used as a memory bus system.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. A refresh control system comprising:
   memory means having a volatile memory for storing data;
   memory control means;
   processing means for accessing said memory means via said memory control means to write data into and read data from said memory by generating memory request signals;
   a memory bus connected to said memory control means and said processing means for effecting signal transfer between said memory control means and said processing means;
   supervision means connected to said memory bus and responsive to a memory request signal from said memory control means for generating a grant signal signifying permission to use said memory bus when it is not in use and for forwarding said grant signal to said memory bus; and
   refresh control means included in said memory control means for transferring a memory request signal signifying a refresh operation to said supervision means via said memory bus at a predetermined time, and generating a signal commanding the execution of the refresh operation to said memory means in response to said grant signal from said supervision means which is generated in response to said request signal for the refresh operation.

2. A refresh control system according to claim 1, in which said processing means comprises at least one central processing unit and at least one peripheral processing unit.

3. A refresh control system according to claim 1, in which said memory means comprises a plurality of memory units.

4. A refresh control system according to claim 1, in which said refresh control means includes a time generating circuit for generating a refresh memory request signal and a memory bus control circuit for transferring said request signal for the refresh operation to said supervision means via said memory bus and for commanding the refresh operation to said memory means in response to the grant signal from said supervision means.

5. A refresh control system according to claim 1, in which said memory bus includes a first signal line for transferring said request signal for the refresh operation from said refresh control means to said supervision means and a second signal line for transferring the grant signal from said supervision means to said refresh control means.

6. A refresh control system according to claim 2, in which said supervision means is provided in said central processing unit.

7. A refresh control system according to claim 5, in which said memory bus further includes third, fourth, and fifth signal lines for transferring a memory initiation signal, an address signal, and an operation mode signal, respectively, from said processing means to said memory control means.

8. A refresh control system according to claim 7, in which said refresh control means includes time generating means for generating a refresh memory request signal periodically in accordance with a predetermined cycle, memory bus control means for transferring the request signal through said first line to said supervision means and for generating a refresh initiation signal in response to the grant signal transferred from said supervision means through said second signal line, and refresh address setting means for setting a refresh memory address signal in response to the refresh request signal from said time generating means.

9. A refresh control system according to claim 8, in which said memory control means includes a memory element of the volatile type, address selection means for transferring address signals from said refresh address setting means and said fourth signal line to said memory element in response to the memory initiation signal, and memory control means for controlling the operation mode of said memory element in response to the operation mode signal and the memory initiation signal.

10. A refresh control system according to claim 8, wherein said memory bus control means includes first and second flip-flop circuits, said first flip-flop circuit having its set input connected to receive the output of said time generating means, said second flip-flop circuit being responsive to the output of said first flip-flop circuit and said grant signal for generating said refresh initiation signal, and delay means having its input connected to receive said grant signal for delaying said grant signal and connected to the output of said second flip-flop circuit such that this delayed grant signal is gated to said processing means only when no refresh initiation signal is granted.

11. A refresh control system according to claim 5, in which said supervision means is means responsive to any of the memory request signals from said refresh control means and said processing means for generating the grant signal signifying permission to use said memory bus when it is not in use and for forwarding the grant signal to said memory bus;

said first signal line is a common line for transferring said memory request signals from said refresh control means and said processing means to said supervision means; and said second signal line is a common line for transferring the grant signal from said supervision means to said refresh control means and said processing means.

12. A refresh control system according to claim 11, in which said refresh control means is connected to said second common signal line between said supervision means and said processing means, and has memory bus control means for receiving the grant signal which propagates on said second common signal line from said supervision means to said refresh control means and for prohibiting the propagation of the grant signal on said second common signal line from the point where said refresh control means is connected thereto to said processing means, when said refresh control means has sent the memory request signal to said supervision means via said first common signal line.

13. A refresh control system according to claim 5, wherein said supervision means is provided in said processing means.

14. A refresh control system according to claim 13, in which:

said processing means comprises first and second processing units;

said supervision means is provided in said first processing unit, said supervision means generating the grant signal in response to any of the memory request signals from said refresh control means and said first and second processing units, and for forwarding the grant signal to said first processing unit in response to the memory request signal from said first processing unit and to said memory bus in response to the memory request signals from said refresh control means and said second processing means;

said first signal line is a common line for transferring said memory request signals from said refresh control means and said second processing unit to said supervision means; and said second signal line is a common line for transferring the grant signal generated by said supervision means in response to said memory request signals on said first common signal line to said refresh control means and said second processing unit.

15. A refresh control system according to claim 14, in which said refresh control means is connected to said second common signal line between said supervision means and said second processing unit and has memory bus control means for receiving the grant signal which propagates on said second common signal line from said supervision means to said refresh control means and for prohibiting the propagation of the grant signal on said second common signal line from the point where said refresh control means is connected thereto to said second processing unit, when said refresh control means has sent the memory request signal to said supervision means via said first common signal line.

* * * * *